United States Patent
Pasotti et al.

(10) Patent No.: US 6,655,758 B2
(45) Date of Patent: Dec. 2, 2003

(54) METHOD FOR STORING DATA IN A NONVOLATILE MEMORY

(75) Inventors: Marco Pasotti, S. Martino Siccomario (IT); Guido De Sandre, Brugherio (IT); Giovanni Guaitini, Trecella (IT); David Iezzi, Osnago (IT); Marco Poles, Ghedi (IT); PierLuigi Rolandi, Monleale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 18 days.

(21) Appl. No.: 10/035,909

(22) Filed: Dec. 19, 2001

(65) Prior Publication Data

US 2002/0118573 A1 Aug. 29, 2002

(30) Foreign Application Priority Data

Dec. 29, 2000 (EP) .............................. 00830866

(51) Int. Cl.[7] .............................. G11C 16/04
(52) U.S. Cl. ..................... 305/185.24; 365/185.03; 365/185.21; 365/185.22
(58) Field of Search ............... 365/185.03, 185.17, 365/185.22, 185.29, 185.24, 185.2, 185.21, 185.12

(56) References Cited

U.S. PATENT DOCUMENTS

| | | | |
|---|---|---|---|
| 4,803,662 A | 2/1989 | Tanaka ..................... 365/185 |
| 5,163,021 A | * 11/1992 | Mehrotra et al. ...... 365/185.03 |
| 5,237,534 A | 8/1993 | Tanaka et al. .............. 365/208 |
| 5,559,737 A | * 9/1996 | Tanaka et al. ......... 365/185.25 |
| 5,946,241 A | * 8/1999 | Zink et al. ............ 365/189.01 |
| 6,009,018 A | 12/1999 | Forbes ................. 365/185.33 |
| 6,011,722 A | 1/2000 | Bude et al. ............ 365/185.24 |
| 6,091,640 A | * 7/2000 | Kawahara et al. ..... 365/185.28 |

OTHER PUBLICATIONS

"Flash File System Selection Guide," *Intel Corporation AP–686 Application Note*, Dec. 1998.

* cited by examiner

Primary Examiner—Hoai Ho
Assistant Examiner—Gene N. Auduong
(74) Attorney, Agent, or Firm—Harold H. Bennett, II; Lisa K. Jorgenson; Seed IP Law Group PLLC

(57) ABSTRACT

Described herein is a method for storing a datum in a first and a second memory cells of a nonvolatile memory. The storage method envisages programming the first and second memory cells in a differential way, by setting a first threshold voltage in the first memory cell and a second threshold voltage different from the first threshold voltage in the second memory cell, the difference between the threshold voltages of the two memory cells representing a datum stored in the memory cells themselves.

30 Claims, 5 Drawing Sheets

METHOD FOR STORING DATA IN A NONVOLATILE MEMORY

BACKGROUND OF THE INVENTION

1. Field of the Invention

The present invention relates to a method for storing data in a nonvolatile memory.

2. Description of the Related Art

As is known, nonvolatile memories comprise an array of memory cells arranged in rows and columns, in which word lines connect the gate terminals of the memory cells arranged in the same row, and bit lines connect the drain terminals of the memory cells arranged in the same column.

It is also known that in a floating-gate nonvolatile memory cell, storage of a logic state is performed by programming the threshold voltage of the memory cell itself through the definition of the amount of electrical charge stored in the floating-gate region.

According to the information stored, memory cells are distinguished into erased memory cells (logic value stored "1"), in the floating-gate regions of which no electrical charge is stored, and written or programmed memory cells (logic value stored "0"), in the floating-gate regions of which an electrical charge is stored which is sufficient to cause a sensible increase in the threshold voltage of the memory cells themselves.

The most widespread method for reading nonvolatile memory cells envisages the comparison of a quantity correlated to the current flowing through the memory cell to be read with a similar quantity correlated to the current flowing through a reference memory cell having a known content.

In particular, to perform reading of a memory cell, a read voltage having a value comprised between the threshold voltage of an erased memory cell and the threshold voltage of a written memory cell is supplied to the gate terminal of the memory cell itself, in such a way that, if the memory cell is written, the read voltage is lower than its threshold voltage, and thus no current flows in the memory cell; whereas, if the memory cell is erased, the read voltage is higher than its threshold voltage, and thus current flows in the memory cell.

Furthermore, in flash nonvolatile memories the memory array is generally divided into various sectors consisting of blocks of memory cells, and in these nonvolatile memories it is possible to carry out reading and programming of individual memory cells of one sector and erasure only of all the memory cells of the sector.

Erasure of memory cells of memory matrices is currently performed by applying a negative voltage to the gate terminals of the memory cells, for example –10 V, bringing the substrate and source terminals to a positive voltage, for example +5 V, and leaving the drain terminals floating.

Erasure by sectors requires particular solutions in terms of memory allocation in so far as account must be taken not only of the fact that whenever a datum stored in a sector is modified it is necessary to erase and re-write the entire sector completely, but also of the fact that each sector is provided with a separator device (which, among other things, enables erasure of the sector independently of the other sectors) having large overall dimensions (of the order of a hundred times the height of a array row).

Consequently, the design of a nonvolatile memory normally involves a compromise between the requirement of dividing up the memory blocks as much as possible to perform erasure only of the elements that actually need to be erased, and the requirement of not increasing excessively the area occupied by the nonvolatile memory as a result of the presence of a high number of separator devices. This compromise, however, does not always enable optimal results to be achieved.

BRIEF SUMMARY OF THE INVENTION

An embodiment of the present invention provides a method for storing data in a nonvolatile memory that makes it possible to avoid erasure of a sector whenever one of the memory cells thereof needs to be re-written.

According to an embodiment of the present invention, a method for storing data in a nonvolatile memory is provided, which includes programming first and second memory cells in a differential way, by setting a first threshold voltage in the first memory cell and a second threshold voltage different from the first threshold voltage in the second memory cell, the difference between the threshold voltages of the two memory cells representing a datum stored in the memory cells themselves.

According to another embodiment of the present invention, a method for reading data in a nonvolatile memory is moreover provided, which includes comparing the threshold voltages of the two memory cells and detecting a difference between them. The exact nature of the difference indicates the nature of the datum stored therein.

Finally, according to another embodiment of the present invention, a nonvolatile memory is provided, which includes two cells that are charged differentially to store a datum.

BRIEF DESCRIPTION OF THE SEVERAL VIEWS OF THE DRAWING(S)

For a better understanding of the present invention, a preferred embodiment thereof will now be described, purely to provide a non-limiting example, with reference to the attached drawings, in which.

DETAILED DESCRIPTION OF THE INVENTION

Figure 1:
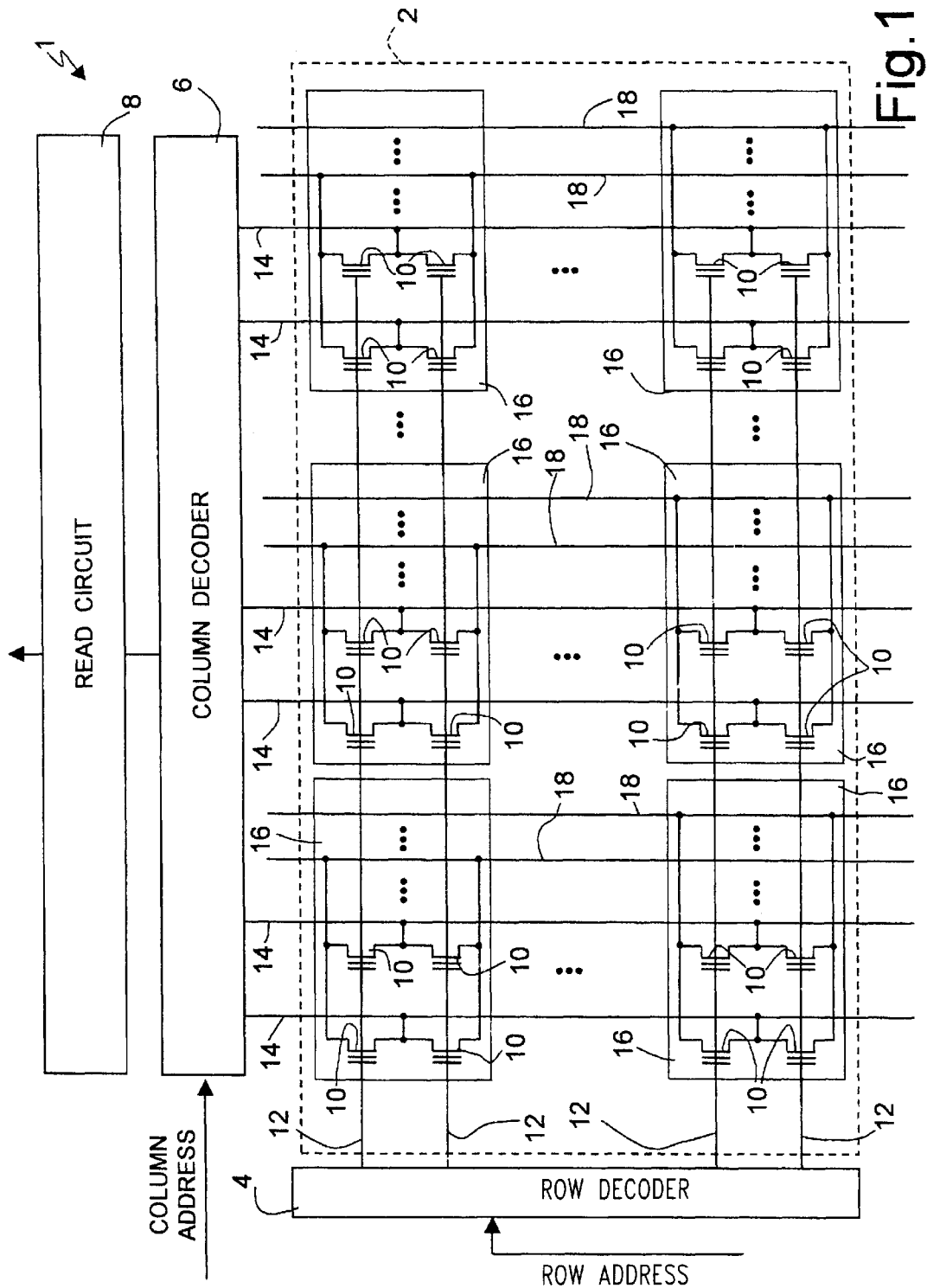
FIG. 1 shows a simplified diagram of a nonvolatile memory comprising a read device according to the present invention.

In FIG. 1, the reference number 1 designates, as a whole, a nonvolatile memory, in particular a flash memory, comprising a memory array 2, a row decoder 4, a column decoder 6, and a read device 8.

In particular, the memory array 2 comprises a plurality of memory cells 10 arranged in rows and columns, a plurality of word lines 12, each of which connects the gate terminals of the memory cells 10 arranged in a same row, and a plurality of bit lines 14, each of which connects the drain terminals of the memory cells 10 arranged in a same column.

The memory cells 10 are moreover grouped into sectors 16 which are also arranged in rows and columns. In each sector 16, the memory cells 10 located in a same row have their gate terminals connected to the same word line 12, to which are also connected the memory cells 10 belonging to adjacent sectors 16 arranged in the same row.

The memory cells 10 belonging to a same sector 16 moreover have their source terminals connected to a same source line 18 which is distinct from the source lines 18 to which the source terminals of the memory cells 10 belonging to the other sectors 16 are connected.

The source lines 18 are then connected to a source-decoding unit (not shown) designed to supply the appropriate biasing to the source lines 18 themselves according to the read, write, and erasure steps envisaged for each sector 18.

The row decoder 4 has an address input receiving the address of the row to be addressed, and a plurality of outputs connected to corresponding word lines 12 for biasing the word line 12 of the row which is addressed each time.

The column decoder 6 has an address input receiving the column address of the column to be addressed, a plurality of data inputs, each of which is connected to a respective bit line 14, and a plurality of data outputs connected to corresponding inputs of the read device 8, which has an output supplying the data read.

In particular, according to the address of the column to be addressed, the column decoder 6 connects the addressed bit line 14 to the read device 8, which supplies at output the datum stored in the memory cell 10 addressed.

Figure 2:
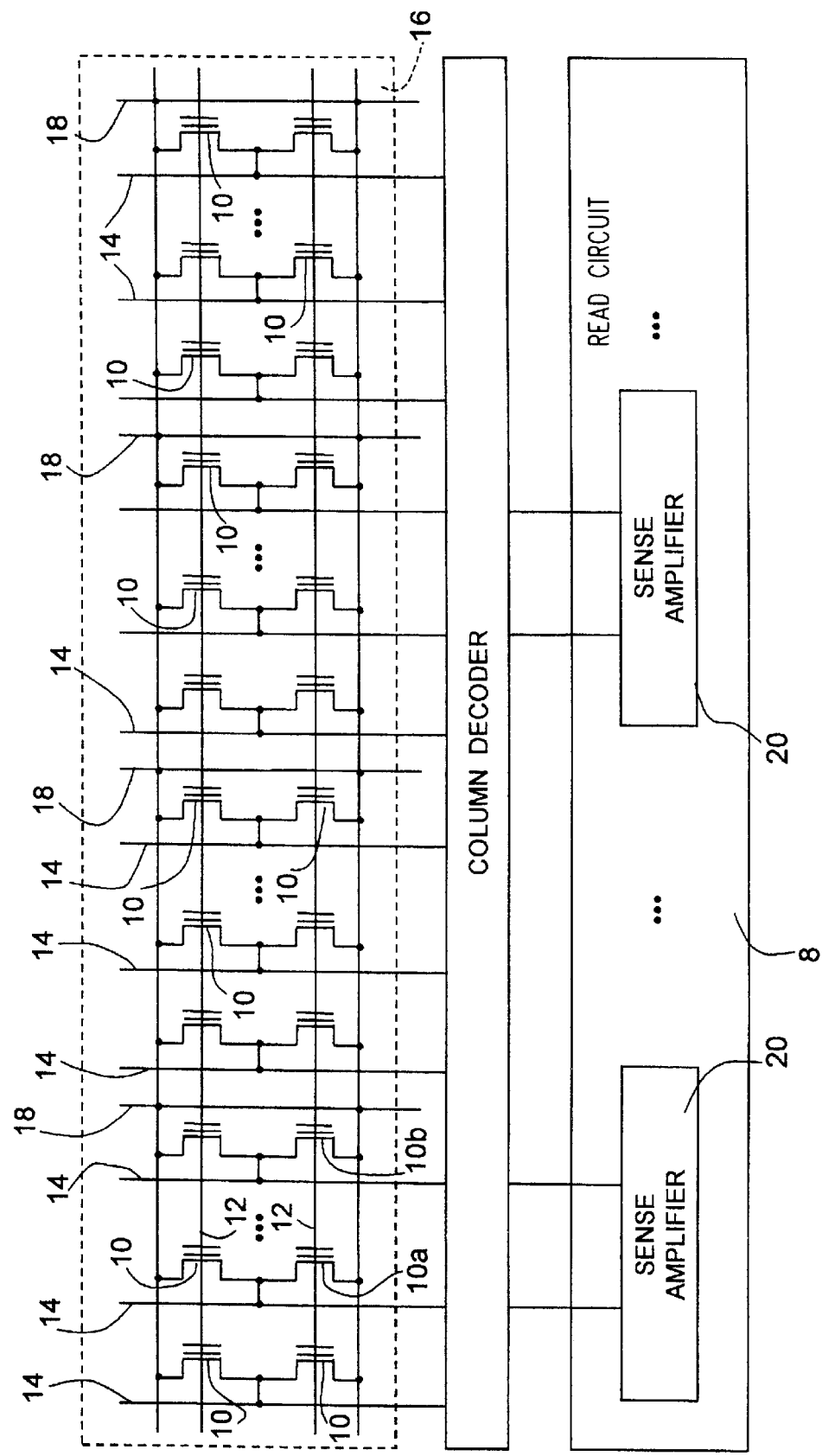
FIG. 2 shows one part of the nonvolatile memory of FIG. 1.

As is shown in greater detail in FIG. 2, which illustrates a sector 16 of the memory array 2 and one part of the read device 8, the read device 8 is formed by a plurality of sense amplifiers 20, each of which is associated to a corresponding set of bit lines 14 of a same sector 16 of the memory array 2, and has a first input and a second input which can be selectively connected, via the column decoder 6, respectively to a first bit line 14 and to a second bit line 14 of the sector 16.

The architecture of the read device 8 described above enables a method for storing data in the memory cells 10 to be implemented that makes it possible to avoid erasure of the sectors whenever the memory cells of said sectors need to be re-written.

For an understanding of the principle underlying the present invention, reference may be made to FIG. 2, in which 10a and 10b designate two specific memory cells of a same sector 16, which are used to explain the inventive principle.

Suppose that initially the memory cells 10a and 10b are erased, i.e., that each of them has a threshold voltage $V_{TH}$ of the order of approximately 1–2 V, which, during reading with a read voltage $V_{READ}$ of approximately 5.5 V, causes a current of the order of 45–35 $\mu$A to flow in the memory cells 10a, 10b.

In this condition, the result of the reading performed by the sense amplifier 20 can be substantially considered random, in so far as it is not known a priori either which of the two memory cells 10a, 10b has the higher threshold voltage or whether the difference between the threshold voltages of the memory cells 10a, 10b is such as to guarantee reading with sufficient reliability (unlike what happens with conventional nonvolatile memories, where, after erasure, all the memory cells contain the same datum, which, conventionally, is assumed as corresponding to the logic value "1").

Now suppose we wish to store a logic value "0."

This storage may be performed by increasing the threshold voltage of the memory cell 10b up to a value of approximately 2.5–3 V, at the same time maintaining the threshold voltage of the memory cell 10a unaltered (1–2 V).

In this condition, if simultaneous reading of the two memory cells 10a, 10b is performed, the memory cell 10a will still draw a current of 45–35 $\mu$A, whereas the memory cell 10b will draw a current of 30–25 $\mu$A, so that the output of the sense amplifier 20 will assume a first logic value to which the logic value "0" is made to correspond.

It is evident that the minimum difference between the currents in the two memory cells 10a, 10b—5 $\mu$A, in the example considered—must be such as to guarantee correct retrieval of the information stored.

Suppose now that we wish to store a logic value "1," assuming that a logic value "0" has been previously stored in the way described above.

This storage may be performed by increasing the threshold voltage of the memory cell 10a up to a value of approximately 3.5–4 V, at the same time maintaining the threshold voltage of the memory cell 10b unaltered (2.5–3 V).

In this condition, when simultaneous reading of the two memory cells 10a, 10b is performed, the memory cell 10a will draw a current of 20–15 $\mu$A, whilst the memory cell 10b will still draw a current of 30–25 $\mu$A, so that the output of the sense amplifier 20 will assume a second level to which the logic value "1" is made to correspond.

It is evident that reprogramming of the threshold voltages of the memory cells 10a, 10b can be repeated until the threshold voltage of one of the memory cells 10a, 10b reaches a maximum value beyond which it is no longer possible to obtain the minimum difference between the currents flowing in the two memory cells 10a, 10b that guarantees correct reading of the information stored.

In the example considered, a further re-programming is still possible by bringing the threshold voltage of the memory cell 10b up to a value of 4.5–5 V, to which there corresponds a current of 10–5 $\mu$A.

Once the maximum programmable value of the threshold voltage has been reached, a further programming necessarily requires erasure of the sector to which the memory cells 10a, 10b belong, so as to bring the memory cells back to the initial condition described above.

From what has been described so far it is evident that a reduction in the minimum difference $\Delta I$ which must exist between the currents flowing in the two memory cells 10a, 10b, to which there corresponds a minimum difference $\Delta V_{TH}$ between the threshold voltages of the two memory cells 10a, 10b, makes it possible to increase the number of re-programmings that may be carried out without having to erase the entire sector 16 to which the two memory cells 10a, 10b belong.

For example, with a minimum voltage difference $\Delta V_{TH}$ of 0.25 V between the threshold voltages of the two memory cells, to which there corresponds a minimum current difference $\Delta I$ of 2.5 $\mu$A, which must exist between the currents flowing in the two memory cells, it is possible to perform seven consecutive re-programmings before having to erase the entire sector.

Generalizing, if n designates the number of different levels that may be assumed by the threshold voltage of a memory cell, with the present arrangement it is possible to perform n-1 consecutive re-programmings before having to erase the entire sector to which the memory cell belongs.

In the light of what has been described above, it is emphasized that, unlike what happens in traditional nonvolatile memories, where storage of a datum is performed by programming a single memory cell, and reading of the latter is performed via a comparison with the contents of a reference memory cell, in the present invention storage of a datum is performed by programming the two memory cells in a differential way, namely, by setting a first threshold voltage in a first memory cell and a second threshold voltage in a second memory cell, the said second threshold voltage being different from the first threshold voltage, and it is precisely the difference between the threshold voltages of the two memory cells that represents the datum stored in the memory cells themselves.

In other words, in contrast to what happens in traditional nonvolatile memory cells, where storage of a datum is performed by using a memory cell the contents of which are not known beforehand and a reference cell the charge status and characteristic of which are known beforehand with a good degree of precision, in the present invention the two memory cells used for storing a datum are equal to one another, belong to a same sector, are conveniently as close as possible to one another in such a way that their characteristics undergo identical variations in time, and their charge status is not known beforehand.

In addition, in contrast to what happens in traditional nonvolatile memories, where storage of a new datum in a memory cell requires erasure of the entire sector to which the memory cell belongs and re-writing of all the memory cells of the sector itself, maintaining the threshold voltage of the reference cell unaltered, in the present invention storage of a new datum is performed by increasing once the threshold voltage of one of the two memory cells, and the next time by increasing the threshold voltage of the other memory cell, until the maximum threshold voltage programmable is reached, beyond which further programming of the memory cells requires erasure of the entire sector.

Figure 3:
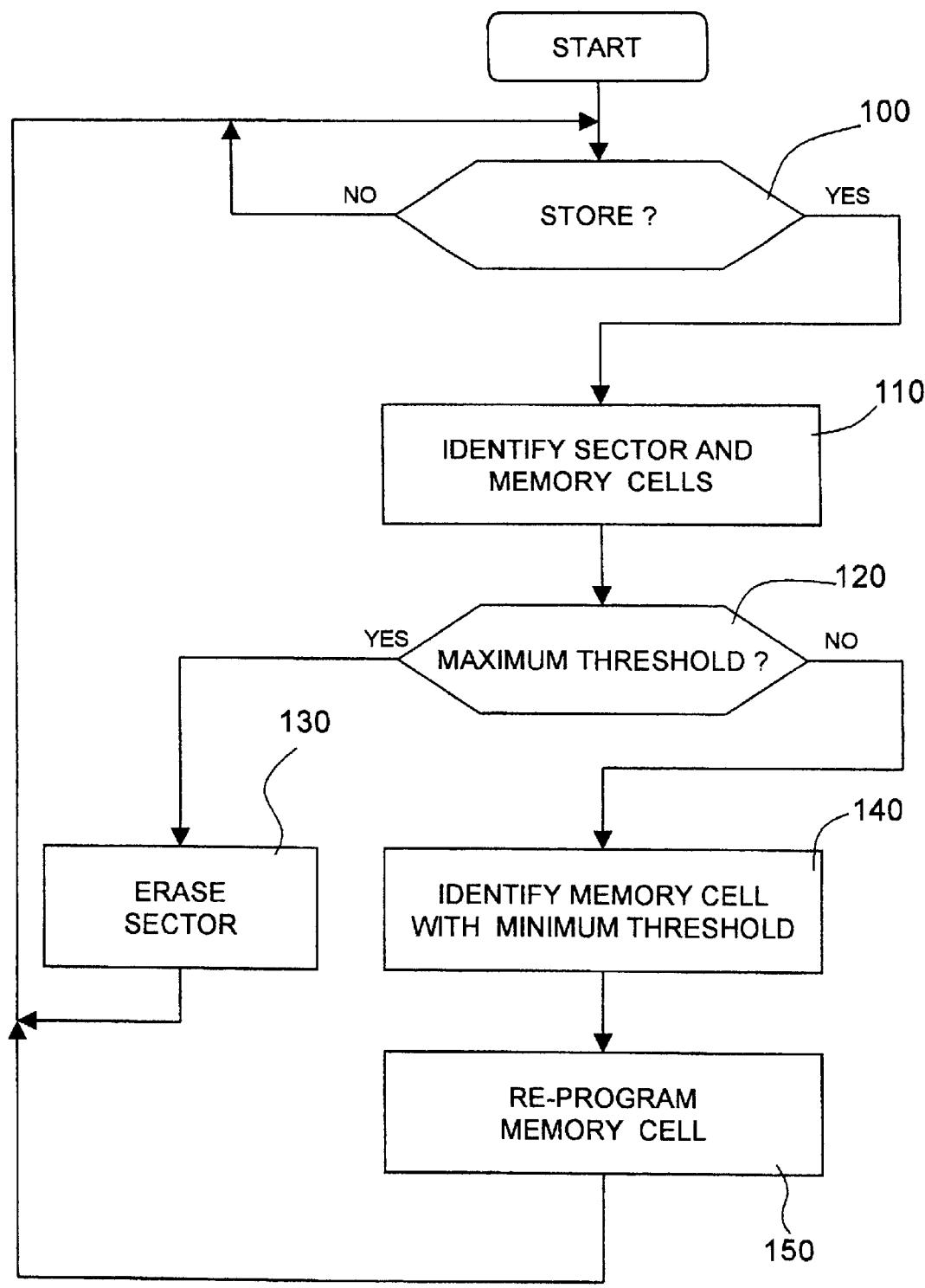
FIG. 3 shows a flow chart of the operations involved in a programming method according to the present invention.

FIG. 3 shows a flowchart of the operations carried out for storing a bit of a binary word in a pair of memory cells of a sector of the memory array.

As is shown in FIG. 3, a verification is initially made as to whether storage of a datum in the given sector of the memory array has been requested (block 100).

If storage has not been requested (output NO from block 100) the program returns to block 100 awaiting a storage request; whereas, if storage has been requested (output YES from block 100), then the sector and the two memory cells in which the datum is to be stored are identified (block 110).

It is next verified whether the threshold voltage of one of the two memory cells already assumes the maximum programmable value (block 120).

If the threshold voltage of one of the two memory cells already assumes the maximum programmable value (output YES from block 120), then the entire sector to which the cells in question belong is erased (block 130), and the program returns to block 100; if, instead neither of the threshold voltages of the two memory cells already assumes the maximum programmable value (output NO from block 120), then re-programming is carried out of the threshold voltage of one of the two memory cells according to the datum to be stored.

In particular, to perform re-programming, first a reading of the memory cells is carried out to find out whether the new datum to be written is different from the one already stored; only in this case it is in fact necessary to perform a new writing, and, from the result of the reading, it is possible to identify automatically which of the two memory cells is the one having the lower threshold voltage (block 140).

If the new datum to be written is different from the one already stored, then re-programming is performed by increasing the threshold voltage of the memory cell having the lower threshold voltage in such a way that the latter will assume a value higher than the value of the threshold voltage of the other memory cell (block 150).

Once re-programming has been performed, the program returns to block 100 awaiting the next request for storage of a datum in the memory array.

Identification of the sector and of the two memory cells where the datum is to be stored is performed in a known way by the row and column decoders according to the addresses supplied to them, whilst determination of the number of re-programmings already performed on the memory cells may be achieved in two different ways: either by storing the number of re-programmings of each memory cell, for example by adding some bits to the binary word to be stored, or else, in a less accurate manner but one that is more efficient from the standpoint of the amount of memory occupied, by storing, in a special register, a flag the logic value of which indicates the fact that any one of the memory cells of the particular sector has already reached the maximum number of re-programmings allowed.

Figure 4:
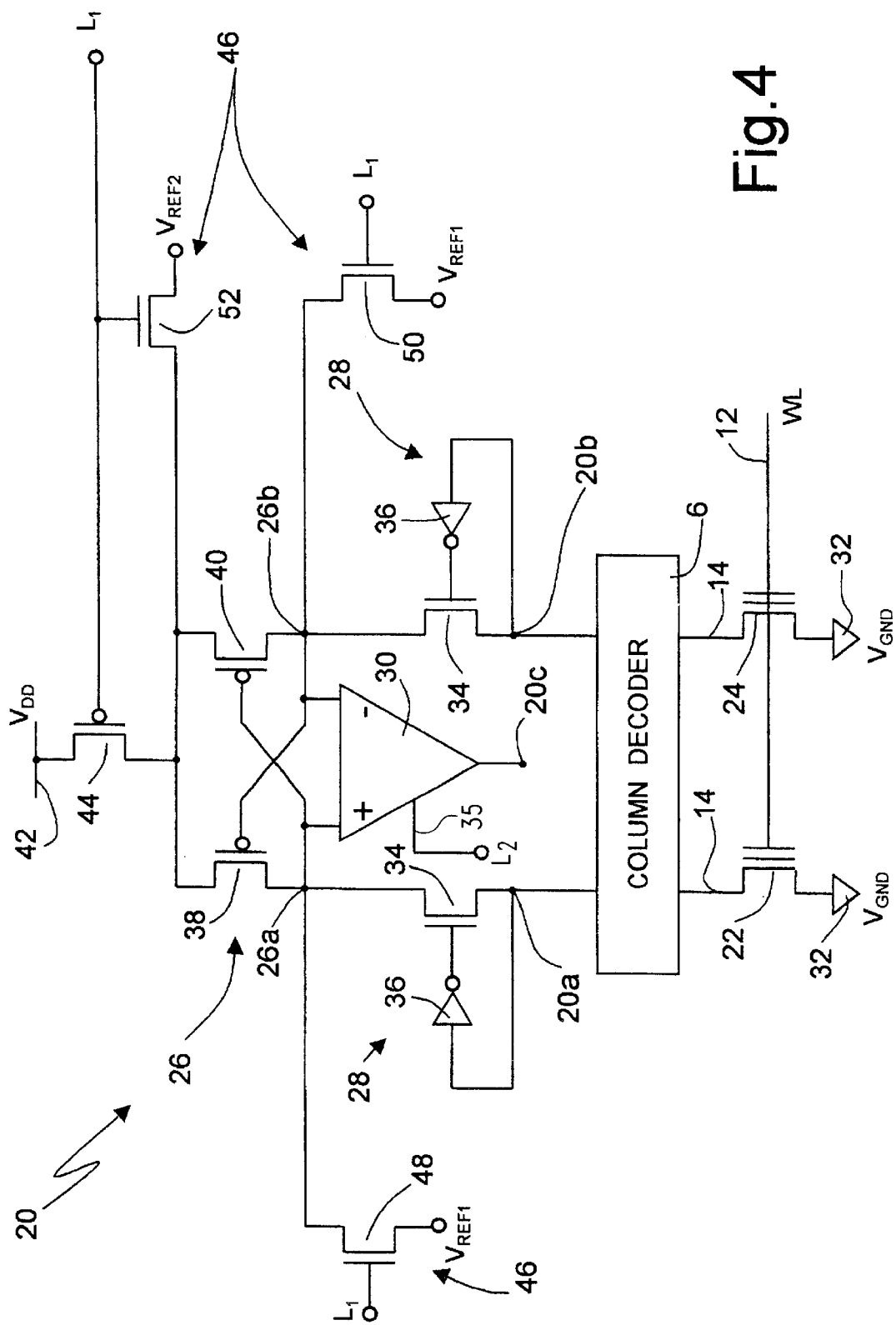
FIG. 4 shows the circuit diagram of a sense amplifier which forms part of the read device of FIG. 1 and is designed to read memory cells containing a single bit.

FIG. 4 shows, by way of non-limiting example, the circuit diagram of a latched sense amplifier used for reading a datum consisting of one bit stored in a pair of memory cells.

The sense amplifier 20 has a first input 20a and a second input 20b respectively connected to the drain terminal of a first memory cell 22 and to the drain terminal of a second memory cell 24 through the column decoder 6, and an output 20c supplying a logic output signal OUT indicating the binary information "0" or "1" stored in the memory cells 22, 24.

The sense amplifier 20 comprises a current-to-voltage converter 26 having a first node 26a and a second node 26b respectively connected to the first input 20a and to the second input 20b of the sense amplifier 20 through respective feedback cascode circuits 28, and on which there are respectively present a first electrical potential and a second electrical potential correlated to the currents flowing in the two memory cells 22, 24 during reading.

Finally, the sense amplifier 20 comprises a differential comparator stage 30 having a first input and a second input respectively connected to the first node 26a and to the second node 26b of the current-to-voltage converter stage 26, and an output connected to the output 20c of the sense amplifier 20, and has the purpose of comparing the first electrical potential and the second electrical potential in order to supply on its own output the aforementioned output signal OUT.

In particular, the memory cells 22, 24 have gate terminals connected to the same word line 12 and receiving the same read voltage $V_{READ}$, drain terminals connected to the corresponding bit lines 14, and source terminals connected to a ground line 32 set at a ground potential $V_{GND}$.

Each feedback cascode circuit 28 has the function of biasing the drain terminal of the corresponding memory cell 22, 24 at a pre-set potential, typically 1 V, and is formed by an NMOS transistor 34 and a regulator 36. In particular, the NMOS transistor 34 has its source terminal connected to a corresponding input node 20a, 20b of the sense amplifier 20 through the column decoder 6, its drain terminal connected to a corresponding node 26a, 26b of the current-to-voltage converter 26, and its gate terminal connected to the output of the corresponding regulator 36, which basically consists of a logic inverter having an input connected to the source terminal of the corresponding NMOS transistor 34.

The current-to-voltage converter 26 basically consists of a current mirror formed by a first PMOS transistor 38 and a second PMOS transistor 40, which have their source terminals connected to a supply line 42 set at a supply voltage $V_{DD}$ through a PMOS transistor 44 which receives a control signal $L_1$ on its own gate terminal, drain terminals respectively connected to the node 26a and to the node 26b, and gate terminals respectively connected to the node 26b and to the node 26a.

The comparator stage 30 is of the latch type and has a non-inverting input terminal and an inverting input terminal respectively connected to the node 26a and to the node 26b, an output terminal supplying the aforementioned output signal OUT, and a control terminal 35 receiving a control signal $L_2$ for controlling turning-on and turning-off of the comparator stage 30.

Finally, the sense amplifier 20 includes an equalization stage 46 comprising a pair of NMOS transistors 48, 50 having gate terminals which receive the aforementioned control signal $L_1$, source terminals set at a reference voltage $V_{REF1}$, and drain terminals respectively connected to the node 26a and to the node 26b.

Finally, the equalization stage 46 comprises an NMOS transistor 52 having a gate terminal which receives the control signal $L_1$, a source terminal connected to the source terminals of the PMOS transistors 38, 40, and a drain terminal set at a reference voltage $V_{REF2}$.

In particular, the reference voltages $V_{REF1}$ and $V_{REF2}$ assume the values to which, during the equalization step (carried out when the control signal $L_1$ assumes a high logic value), it is intended to bring the nodes 26a and 26b and the source terminals of the PMOS transistors 38, 40. In particular, the reference voltages $V_{REF1}$ and $V_{REF2}$ could assume values equal to that of the ground voltage $V_{GND}$, or else equal to the supply voltage $V_{DD}$, or else equal to a value intermediate between the ground voltage $V_{GND}$ and the supply voltage $V_{DD}$.

The operation of the sense amplifier 20 described above is in itself known, and consequently will not be described in detail herein.

According to a further aspect of the present invention, what has been described above in reference to programming of data consisting of a single bit may be easily extended also to programming of data formed by n bits.

In fact, whilst in order to store one-bit data in two memory cells it is sufficient to program different threshold voltages in the memory cells, and to perform reading of one-bit data it is sufficient to discriminate which of the two memory cells has a higher or lower threshold voltage, in order to store n-bit data in two memory cells it is necessary to program threshold voltages having well-defined values in the two memory cells, in such a way that the difference between the said threshold voltages will assume a discrete number of values equal to $2^n$, to each of which a respective n-bit datum is associated.

In this way, in order to perform reading of n-bit data it is necessary to quantify, as regards modulus and sign, the difference between the threshold voltages of the two memory cells 22, 24, and to convert this difference into an n-bit binary word, which can be performed in the classic way by comparing the difference with a plurality of intervals of pre-set values to each of which a corresponding n-bit word is associated, and then by determining the binary word associated to the range of values within which the said difference is included.

Figure 5:
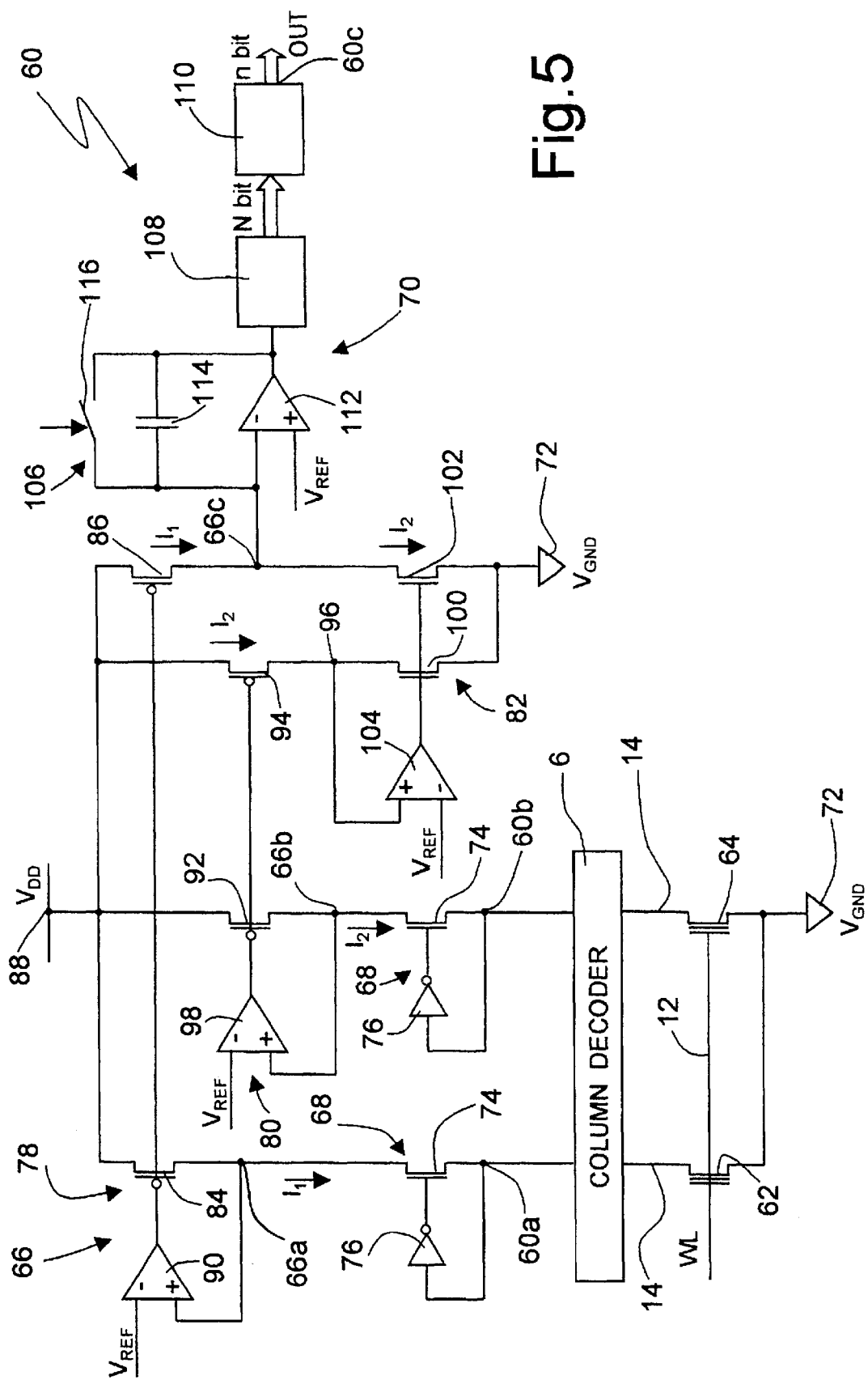
FIG. 5 shows the circuit diagram of a different sense amplifier which forms part of the read device of FIG. 1 and is designed to read memory cells containing a number of bits.

FIG. 5 shows, by way of non-limiting example, the circuit diagram of a sense amplifier which can be used for reading an n-bit datum stored in two memory cells.

The sense amplifier, designated as a whole by 60, has a first input 60a and a second input 60b which are respectively connected to the drain terminal of a first memory cell 62 and to the drain terminal of a second memory cell 64 through the column decoder 6, and an output 60c supplying an n-bit binary output word OUT indicating the datum stored in the memory cells 62, 64.

The sense amplifier 60 comprises a current-to-voltage converter 66 having a first input node 66a and a second input node 66b respectively connected to the first input 60a and to the second input 60b of the sense amplifier 60 through corresponding fedback cascode circuits 68, and an output node 66c supplying a current proportional to the difference between the currents flowing in the memory cells 62, 64 during reading.

Finally, the sense amplifier 60 comprises an analog-to-digital converter stage 70 having an input connected to the output node 66c of the current-to-voltage converter stage 66 and an output supplying the binary output word OUT.

In particular, the memory cells 62, 64 have gate terminals connected to the same word line 12 and receiving the same read voltage $V_{READ}$, drain terminals connected to the respective bit lines 14, and source terminals connected to a ground line 72 set at a ground potential $V_{GND}$.

Each fedback cascode circuit 68 has the purpose of biasing the drain terminal of the corresponding memory cells 62, 64 at a pre-set potential, typically 1 V, and is formed by an NMOS transistor 74 and a regulator 76. In particular, the NMOS transistor 74 has a source terminal connected to a corresponding input node 60a, 60b of the sense amplifier 60 through the column decoder 6, a drain terminal connected to a corresponding node 66a, 66b of the current-to-voltage converter 66, and a gate terminal connected to the output of the corresponding regulator 76, which is essentially formed by a logic inverter having an input connected to the source terminal of the respective NMOS transistor 74.

The current-to-voltage converter 66 comprises three current mirrors 78, 80, 82. The first current mirror 78 comprises a pair of PMOS transistors 84, 86 having source terminals connected to a supply line 88 set at the supply voltage $V_{DD}$, gate terminals connected together, and drain terminals respectively connected to the input node 66a and to the output node 66c of the current-to-voltage converter 66. The first current mirror 78 moreover comprises an operational amplifier 90 having an inverting input which receives a reference voltage $V_{REF}$, a non-inverting input connected to the input node 66a, and an output connected to the gate terminals of the PMOS transistors 84, 86.

The second current mirror 80 comprises a pair of PMOS transistors 92, 94 having source terminals connected to the supply line 88, gate terminals connected together, and drain terminals respectively connected to the input node 66b of the current-to-voltage converter 66 and to an intermediate node 96. The second current mirror 80 moreover comprises an operational amplifier 98 having an inverting input which receives a reference voltage $V_{REF}$, a non-inverting input connected to the input node 66b of the current-to-voltage converter 66, and an output connected to the gate terminals of the PMOS transistors 92, 94.

The third current mirror 82 comprises a pair of NMOS transistors 100, 102 having source terminals connected to the ground line 72, gate terminals connected together, and drain terminals respectively connected to the intermediate node 96 and to the output node 66c of the current-to-voltage converter 66. The third current mirror 82 further comprises an operational amplifier 104 having an inverting input which receives a reference voltage $V_{REF}$, a non-inverting input connected to the intermediate node 96, and an output connected to the gate terminals of the NMOS transistors 100, 102.

The analog-to-digital converter stage 70 comprises an integrator 106, an analog-to-digital converter 108 proper, and a binary-decoding stage 110 cascaded together.

In particular, the integrator 106 comprises a fedback operational amplifier 112 which has a non-inverting input receiving the reference voltage $V_{REF}$, and inverting input connected to the output node 66c of the current-to-voltage converter 66, and an output connected to an input of the analog-to-digital converter 108 proper.

The integrator 106 further comprises an integration capacitor 114 and a reset switch 116 connected together in parallel between the output and the inverting input of the operational amplifier 104.

The analog-to-digital converter 108 has an output supplying an N-bit binary word, preferably with N=2n, indicating the electrical potential present on the output of the integrator 106, and the said N-bit binary word is supplied to an input of the binary-decoding stage 110, which converts it into a corresponding n-bit binary output word OUT.

Operation of the sense amplifier 60 described above is illustrated below.

The first current mirror 78 mirrors, on the output node 66c of the current-to-voltage converter 66, the current, designated by $I_1$ in the figure, that flows in the memory cell 62; the second current mirror 80 mirrors, on the intermediate node 96, the current, designated by $I_2$ in the figure, that flows in the memory cell 64; and the third current mirror 82 further mirrors the said current $I_2$ on the output node 66c of the current-to-voltage converter 66, in which the difference between the current $I_1$ and the current $I_2$ is performed.

Consequently, the electrical potential present on the output node 66c of the current-to-voltage converter 66 is proportional to the difference between the current $I_1$ and the current $I_2$ that flow respectively in the two memory cells 62, 64.

The integrator 106 performs integration of the difference between the current $I_1$ and the current $I_2$, so that the electrical potential on the output of the integrator 106 follows a ramp-like pattern, the initial value of which is equal to $V_{REF}$ (the value present upon turning-on of the nonvolatile memory, following upon closing of the reset switch 116), and the slope of which is proportional to the difference between the current $I_1$ and the current $I_2$.

After a pre-set integration time, then, the electrical potential on the output of the integrator 106 assumes a value indicating both the module and the sign of the difference between the currents flowing in the memory cells 62, 64. In particular, if, once the aforesaid integration time has elapsed, the voltage on the output of the integrator 106 is higher than $V_{REF}$, then this is indicative of the fact that the current $I_1$ is smaller than the current $I_2$; whereas if, once the said integration time has elapsed, the voltage on the output of the integrator 106 is lower than $V_{REF}$, then this is indicative of the fact that the current $I_1$ is greater than the current $I_2$. The difference between the voltage on the output of the integrator 106 and $V_{REF}$ is then indicative of the difference between the current $I_1$ and the current $I_2$.

Assuming, for example, that the integration capacitor has a capacitance of 15 pF, that the maximum difference between the current $I_1$ and the current $I_2$ is, in absolute value, 50 $\mu$A, that the integration time is 250 ns, and that $V_{REF}$=0.8 V (initial value of the output voltage $V_{OUT}$ of the integrator), if $I_1$–$I_2$=50 $\mu$A, then during the 250 ns in which integration is performed the output voltage $V_{OUT}$ goes from 0.8 V to 0 V, whilst if $I_1$–$I_2$=–50 $\mu$A, then the output voltage $V_{OUT}$ goes from 0.8 V to 1.6 V.

The output voltage $V_{OUT}$ of the integrator 106 is then converted into a corresponding N-bit binary word, which is next coded into a corresponding n-bit output word OUT according to a coding criterion which may be either established in the design phase or be requested by the end user.

In the sense amplifier 60, the operational amplifiers 90, 98, 104 perform the function of maintaining the input nodes 66a, 66b and the intermediate node 96 (which practically constitute the virtual ground of the sense amplifier 60) at an electrical potential equal to $V_{REF}$, and likewise the operational amplifier 112 causes the output of the integrator 106 to be of a balanced type and consequently to evolve at around $V_{REF}$.

The advantages afforded by the present invention emerge clearly from an examination of its characteristics.

In particular, the most evident advantage lies in the possibility of re-programming a memory cell a certain number of times before having to erase the sector to which it belongs, with evident considerable advantages from both the standpoint of memory allocation and the standpoint of designing of the memory.

In addition, storage of a datum as the difference between the threshold voltages of two memory cells belonging to the same row of the same sector and being set close to one another enables a considerable reduction in capacitive mismatches, and hence a considerable increase in reading speed, in this way enabling optimal trade-off between re-programmability of the memory and speed of access to the data stored.

The nonvolatile memory of FIG. 1 has access times of the order of 10 ns, so that they can be used in microprocessors operating at a frequency of the order of 100 MHz, and enable re-programmability of the memory at byte level.

Furthermore, it is evident that storage of a datum performed according to the embodiment of FIG. 3 inevitably involves doubling of the area occupied by the memory array. However, this doubling of the area occupied is acceptable practically in all applications in view of the significant advantages deriving from the implementation of the present invention.

In particular, in all the applications in which the nonvolatile memory is associated to a microcontroller, the area occupied by the memory array represents only a small percentage (typically, approximately 30%) of the total area occupied by the device in which the memory array is used, so that the increase in the area occupied by the memory array reflects in an attenuated way on the increase in the overall area occupied by the memory device.

If, for example, we consider a memory device according to the prior art and comprising a microcontroller, in which the overall area occupied by the memory device is approximately 40 mm$^2$ and the area occupied by the memory array is approximately 15 mm$^2$, in a similar memory device that implements the present invention the area occupied by the memory array becomes approximately 30 mm$^2$, whilst the overall area occupied by the memory device becomes approximately 55 mm$^2$. Consequently, against a doubling of the area occupied by the memory array, the overall area occupied by the memory device increases only by 38%, a value which is decidedly acceptable if viewed in the light of the significant advantages that the present invention affords in terms of memory allocation and flexibility of designing of the memory.

Finally, it is clear that modifications and variations may be made to what has been described above, without thereby departing from the sphere of protection of the present invention, defined in the attached claims.

For example, the generation of the output word OUT could be performed differently from what has been described; in particular, it could be performed in a dichotomous way, i.e., by comparing the difference between the currents flowing in the two memory cells with successive thresholds and generating, after each comparison, one bit of the binary output word OUT. In particular, the comparison of the difference between the currents flowing in the array memory cells and reference memory cells and the various thresholds may be made in a simple way by using current mirrors having appropriate mirror ratios.

In addition, re-programming of the memory cells could be performed in a way different from what has been described. In particular, instead of being performed by increasing alternately the threshold voltages starting from a minimum value and up to a maximum value beyond which erasure of the sector to which the memory cells belong is carried out, re-programming could also be performed by alternately decreasing the threshold voltages starting from a maximum value down to a minimum value below which erasure of the sector to which the memory cells belong is performed.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for storing data in a nonvolatile memory array having first and second memory cells, comprising:
    programming said first and second memory cells of the memory array in a differential way, wherein said step of programming said first and second memory cells in a differential way comprises:
        setting a first threshold voltage in said first memory cell; and
        setting a second threshold voltage different from said first threshold voltage in said second memory cell; the difference between the threshold voltages of said first and second memory cells representing a datum stored in the first and second memory cells.

2. The storage method according to claim 1, further comprising the step of re-programming one of said first and second memory cells to store a new datum.

3. The storage method according to claim 2, further comprising:
    verifying whether the new datum to be stored in said first and second memory cells is different from the datum stored in the memory cells themselves; and
    re-programming one of said first and second memory cells in order to store said new datum in the case where the latter is different from the datum stored.

4. The storage method according to claim 1, wherein said difference between the threshold voltages of said first and second memory cells represents one bit stored in the first and second memory cells.

5. The storage method according to claim 1, wherein said difference between the threshold voltages of said first and second memory cells represents a plurality of bits stored in the first and second memory cells.

6. The method of claim 1 wherein the threshold voltages of the first and second memory cells are set in response to determining the value of the datum to be stored in the first and second memory cells.

7. A method for storing data in a nonvolatile memory having first and second memory cells, comprising:
    programming said first and second memory cells in a differential way, wherein said step of programming said first and second memory cells in a differential way includes:
        setting a first threshold voltage in said first memory cell, and
        setting a second threshold voltage different from said first threshold voltage in said second memory cell, the difference between the threshold voltages of said first and second memory cells representing a datum stored in the first and second memory cells; and
    re-programming one of said first and second memory cells to store a new datum, wherein said step of re-programming one of said first and second memory cells includes the steps of:
        identifying, between said first and second memory cells, the memory cell having a voltage satisfying a first relation with respect to the threshold voltage of the other memory cell, and
        varying the threshold voltage of the memory cell identified in such a way that it satisfies a second relation, different from said first relation, with respect to the threshold voltage of the other memory cell.

8. The storage method according to claim 7, wherein said first relation is defined by the condition that the threshold voltage of said identified memory cell is lower than the threshold voltage of the other said memory cell.

9. The storage method according to claim 7 wherein said second relation is defined by the condition that the threshold voltage of said identified memory cell is higher than the threshold voltage of the other said memory cell.

10. The storage method according to claim 7, further comprising the steps of:
    comparing the threshold voltages of said first and second memory cells with a reference value;
    varying the threshold voltage of said identified memory cell in the case where the threshold voltages of said first and second memory cells has a third pre-set relation with said reference value; and
    erasing said first and second memory cells in the case where the threshold voltages of said first and second memory cells do not have said third pre-set relation with said reference value.

11. The storage method according to claim 10, wherein said third relation is defined by the condition that both of the threshold voltages of said first and second memory cells are lower than said reference value.

12. The storage method according to claim 7, further comprising the step of dividing a range of the values that may be assumed by each of the threshold voltages of said first and second memory cells into a plurality of intervals of a pre-set amplitude; and in that said step of programming said first and second memory cells in a differential way comprises the step of setting, in said first and second memory cells, respective threshold voltages belonging to successive intervals.

13. The storage method according to claim 12, wherein said step of varying the threshold voltage of said identified memory cell comprises the step of bringing its threshold voltage to a value comprised in the interval following on the one to which the threshold voltage of the other said memory cell belongs.

14. A nonvolatile memory, comprising:
at least a first and a second memory cells; and
storage means for storing data in said first and second memory cells, including programming means for programming said first and second memory cells in a differential way, the programming means including means for selectively changing a threshold voltage of either the first or second memory cell as required to establish a difference in threshold voltages of the first and second memory cell, the difference representing a selected datum.

15. A method, comprising:
addressing first and second memory cells associated with a single datum;
comparing a threshold voltage of the first memory cell to a threshold voltage of the second memory cell; and
wherein a difference between the threshold voltages of the first and second memory cells represents a datum stored in the first and second memory cells.

16. The method of claim 15 wherein, if the threshold voltage of the first memory cell exceeds that of the second memory cell, the datum is a first logic value, and wherein if the threshold voltage of the second memory cell exceeds that of the first memory cell, the datum is a second logic value.

17. The method of claim 15 wherein a range of possible threshold voltages that the first or second memory cells may have is divided into a plurality of intervals.

18. The method of claim 17 wherein the datum is a binary word and each of a plurality, greater than two, of binary words is represented by a different number of intervals between the threshold voltage of the first memory cell and the threshold voltage of the second memory cell.

19. A method comprising:
addressing first and second memory cells of a memory array for storage of a datum; and
charging the first and second memory cells differentially as a way of storing the datum.

20. The method of claim 19 wherein the charging step is performed by increasing a threshold voltage of the first or second memory cell.

21. The method of claim 19 wherein the charging step comprises charging the first memory cell to a threshold voltage greater than that of the second memory cell to represent a first logic level, and charging the second memory cell to a threshold voltage greater than that of the first memory cell to represent a second logic level.

22. The method of claim 21, further comprising the step of comparing the threshold voltages of the first and second memory cells, and, unless a logic level represented by the difference of threshold voltages between the first and second memory cells is equal to a new logic level to be stored in the memory cells, then repeating the charging step.

23. The method of claim 22 wherein, if the logic level represented by the difference of threshold voltages between the first and second memory cells is not equal to the logic level to be stored in the memory cells, and if either the first or second memory cell is at a maximum threshold voltage, then reducing the threshold voltages of the first and second memory cells to a minimum threshold voltage prior to repeating the charging step.

24. The method of claim 19 wherein a range of possible threshold voltages to which the first or second memory cells may be charged is divided into a plurality of intervals.

25. The method of claim 24 wherein each of a plurality of binary words is represented by a different number of intervals between the threshold voltage of the first memory cell and the threshold voltage of the second memory cell.

26. A memory device comprising:
first and second memory cells;
a programming circuit configured to increase a threshold voltage of the first and second memory cells; and
a comparator circuit configured to compare the threshold voltages of the first and second memory cells, and to output a datum based upon the difference of the threshold voltages of the first and second memory cells.

27. The memory device of claim 26 wherein:
to store a datum of a first type, the programming circuit is configured to increase the threshold voltage of the first memory cell until it exceeds that of the second memory cell, or, in a case in which the first memory cell is already at a higher threshold voltage than that of the second memory cell, to leave the condition of the first and second memory cells unchanged; and
to store a datum of a second type, the programming circuit is configured to increase the threshold voltage of the second memory cell until it exceeds that of the first memory cell, or, in a case in which the second memory cell is already at a higher threshold voltage than that of the first memory cell, to leave the condition of the first and second memory cells unchanged.

28. The memory device of claim 27, further including an erase circuit configured to reduce the threshold voltage of the first and second memory cells to a minimum threshold voltage.

29. The memory device of claim 28 wherein, in the event that the first or second memory cell is at a maximum threshold voltage, the memory device is configured to erase the first and second memory cells prior to storing a datum.

30. The memory device of claim 26 wherein the comparator circuit outputs a datum of a first type when the threshold voltage of the first memory cell exceeds that of the second memory cell, and outputs a datum of a second type when the threshold voltage of the second memory cell exceeds that of the first memory cell.

* * * * *